United States Patent [19]
Unami et al.

[11] Patent Number: 6,114,800
[45] Date of Patent: Sep. 5, 2000

[54] PIEZOELECTRIC COMPONENT

[75] Inventors: Toshihiko Unami, Omihachiman; Tetsuo Takeshima; Makoto Irie, both of Toyama, all of Japan

[73] Assignee: Murata Manufacturing Co., Ltd, Kyoto, Japan

[21] Appl. No.: 09/160,931

[22] Filed: Sep. 25, 1998

[30] Foreign Application Priority Data

Oct. 1, 1997 [JP] Japan .................................... 9-286180
Oct. 3, 1997 [JP] Japan .................................... 9-287671
Sep. 1, 1998 [JP] Japan .................................... 10-247203

[51] Int. Cl.$^7$ .................................................. H01L 41/04
[52] U.S. Cl. .......................................... 310/344; 310/348
[58] Field of Search ...................................... 310/344, 348

[56] References Cited

U.S. PATENT DOCUMENTS

| | | | |
|---|---|---|---|
| 2,454,244 | 11/1948 | Wintermute | 310/344 |
| 3,969,640 | 7/1976 | Staudte | 310/344 |
| 4,293,986 | 10/1981 | Kobayashi et al. | 310/344 |
| 4,405,875 | 9/1983 | Nagai | 310/344 |
| 5,939,819 | 8/1999 | Unami et al. | 310/348 |

*Primary Examiner*—Nestor Ramirez
*Assistant Examiner*—Peter Medley
*Attorney, Agent, or Firm*—Joseph R. Keating, Esq.; Keating & Bennett, LLP

[57] ABSTRACT

A piezoelectric component includes a substrate on which a piezoelectric resonator is mounted with supporting members interposed therebetween. The substrate is covered by a cap which is arranged to cover the piezoelectric resonator. A rubber-like elastic material such as a silicone resin is injected through a hole of the cap to cover the periphery of the piezoelectric resonator. Preferably, the Young's modulus of the rubber-like elastic material is not larger than about 12 kgf/cm$^2$.

21 Claims, 12 Drawing Sheets

PIEZOELECTRIC COMPONENT

BACKGROUND OF THE INVENTION

1. Field of the Invention

The present invention relates to a piezoelectric component, and more particularly, a piezoelectric component such as an oscillator, a discriminator or a filter incorporating a piezoelectric resonator.

2. Description of the Related Art

FIG. 20 is a diagram showing an example of a piezoelectric component relating to the present invention. A piezoelectric component 101 includes a substrate 102. As shown in FIG. 21, pattern electrodes 103a and 103b are disposed on the substrate 102 and supporting members 104 formed of an electroconductive material located on external electrodes 106a and 106b of a piezoelectric component 105 are attached on the pattern electrodes 103a and 103b via bonding or similar process. For example, the piezoelectric resonator 105 includes a base member 105a in which a plurality of piezoelectric layers and electrodes are laminated. The two external electrodes 106a and 106b extending in the longitudinal direction are located on one side surface of the base member 105a and are connected to the electrodes of the base member 105a. The piezoelectric layers are polarized along the longitudinal direction of the base member 105a. A signal is supplied between the external electrodes 106a and 106b to apply electric fields in the longitudinal direction of the base member 105a. The electric fields cause the piezoelectric layers to expand and contract, thus exciting fundamental vibration in the base member 105a in the longitudinal direction.

A silicone resin 107 or the like is applied to upper and lower surfaces of the piezoelectric resonator 105. A substrate 102 is covered by a cap 108 so as to cover the piezoelectric resonator 105. In this piezoelectric component 101, a signal is input between the pattern electrodes 103a and 103b to generate fundamental vibration of longitudinal vibration in the piezoelectric resonator 105. The piezoelectric resonator 105 caused to vibrate in this manner has its mechanical quality factor Qm adjusted by the application of silicone resin 107 to the piezoelectric resonator 105 which increases the vibration load on the piezoelectric resonator 105.

In the piezoelectric component 101 shown in FIG. 20, however, there is a possibility of water vapor entering inside the cap 108 through the adhesive between the insulating substrate 102 and the cap 108 and condensing on the surface of the piezoelectric resonator and so on due to a change in temperature. In such a case, when the piezoelectric component 101 is mounted by reflow soldering, condensed water vaporizes to abruptly increase the atmospheric pressure inside the cap 108, thereby producing a force which lifts the cap 108. Such a force may cause the cap 108 to come off or be removed from the substrate 102.

In addition, a sufficient amount of silicone resin 107 cannot be supplied because of spreading and running of silicone resin 107 at the time of application of silicone resin 107, resulting in a failure to accurately adjust Qm of the piezoelectric resonator to the desired value. In the case where a ladder filter is formed by using, for example, four piezoelectric resonators as shown in FIG. 22, a variation in the amount of silicone resin 107 occurs between piezoelectric resonators 105 due to spreading and running of silicone resin 107, and the desired Qm of each resonator cannot be obtained.

Further, since silicone resin 107 is supplied before covering the resonator(s) with the cap 108 in the piezoelectric component 101 constructed as described above, silicone resin 107 is interposed between the substrate 102 and the cap 108 if the resin 107 spreads to the cap attachment portion of the substrate 102. In such a situation, cap attachment failure results. To avoid such a failure, it is necessary to increase the size of the substrate 102 by an amount which is larger than an area through which the silicone resin 107 can spread. Because of this problem, it has been difficult to reduce the size of the piezoelectric component 101.

SUMMARY OF THE INVENTION

To overcome the problems described above, the preferred embodiments of the present invention provide a significantly smaller electronic component having a cap which is securely maintained on the component and which is constructed to allow for accurate adjustment of Qm.

The preferred embodiments of the present invention also provide an electronic component having a cap which is securely maintained on the substrate of the component and the cap has a hole extending from a space between the cap and an interior of the component to outside of the cap.

The preferred embodiments of the present invention further provide a communication apparatus including an electronic component having a cap which is securely maintained on the substrate of the component and the cap has a hole extending from a space between the cap and an interior of the component to outside of the cap.

Since an air hole is provided in the cap, condensation does not occur on the surfaces of the piezoelectric resonators or other surfaces inside of the component even if water vapor enters inside of the cap. Therefore, when, for example, the electronic component is mounted by reflow soldering, the pressure inside the cap is not increased and no lifting force is applied to the cap and, as a result, the cap is not caused to be removed from the component.

In the above described electronic component, a rubber-like elastic material may be injected through the hole of the cap to cover the periphery of the piezoelectric resonator.

Since the rubber-like elastic material is injected into the space between the cover and the interior of the component so that the periphery of the piezoelectric resonator is covered with the rubber-like elastic material, the state of adhesion of the rubber-like elastic material is uniform between the piezoelectric components. As a result, a desired Qm is easily and accurately set by suitably selecting the Young's modulus of the rubber-like elastic material.

Based on the relationship between the Young's modulus of the rubber-like elastic material and the loss due to constraint of vibration of the piezoelectric resonator, it is preferred that the Young's modulus of the rubber-like elastic material is not larger than about 12 kgf/cm$^2$. For example, a silicone resin may be preferably used as such a rubber-like elastic material.

In the above described electronic component, the piezoelectric resonator may be vibrated in a longitudinal vibration mode. Further, the piezoelectric resonator may include a base member having a longitudinal direction and including a plurality of laminated piezoelectric layers and a plurality of internal electrodes arranged to be substantially perpendicular to the longitudinal direction of the base member and along the longitudinal direction of the base member while being spaced apart from each other, the plurality of internal electrodes being provided on surfaces on the piezoelectric layers and substantially perpendicular to the longitudinal direction of the base member, and a pair of external electrodes provided on a surface of the base member and connected to the plurality of internal electrodes, and the plurality of piezoelectric layers being polarized along the longitudinal direction of the base member.

According to the above structure, each piezoelectric resonator is preferably a stiffened type resonator in which the direction of polarization and the direction of an electric field coincide with the direction of vibration. Therefore, the electromechanical coupling coefficient of the piezoelectric resonator is greater than that of unstiffened type piezoelectric resonators in which the direction of vibration differs from the direction of polarization and the direction of an electric field, so that the difference ΔF between a resonant frequency and an antiresonant frequency is greatly increased. Another effect of using the stiffened type piezoelectric resonator is that vibration in a mode such as a width mode or thickness mode, which are different from the fundamental vibration of longitudinal vibration, cannot occur easily, thus reducing spurious vibration.

The above-described piezoelectric component structure can also be applied to a ladder filter having a plurality of piezoelectric resonators.

Other features and advantages of the present invention will become apparent from the following description of preferred embodiments of the invention which refers to the accompanying drawings.

DETAILED DESCRIPTION OF PREFERRED EMBODIMENTS

Figure 1:
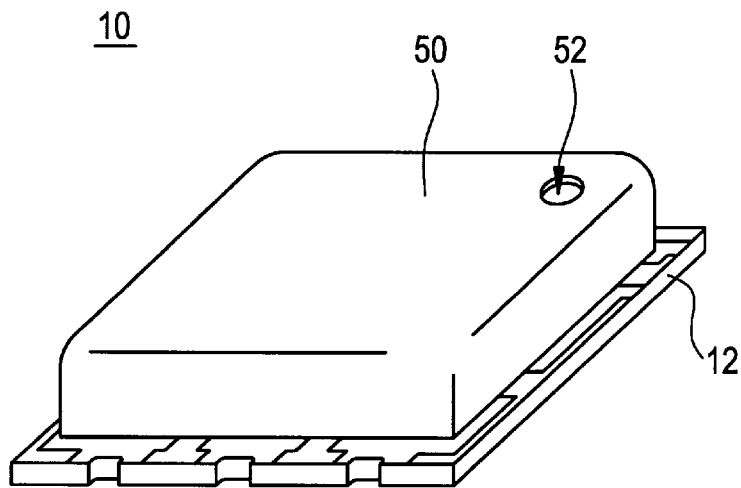
FIG. 1 is a perspective view of a first preferred embodiment of a ladder filter in accordance with the present invention.
Figure 3:
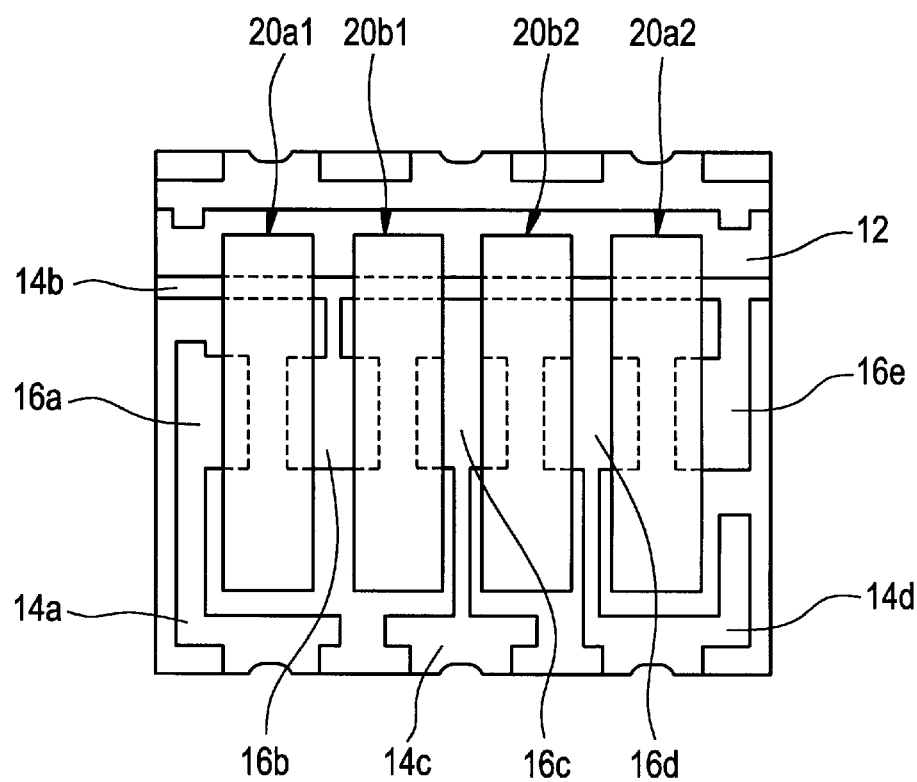
FIG. 3 is a plan view of an essential portion of the ladder filter shown in FIG. 1.
Figure 2:
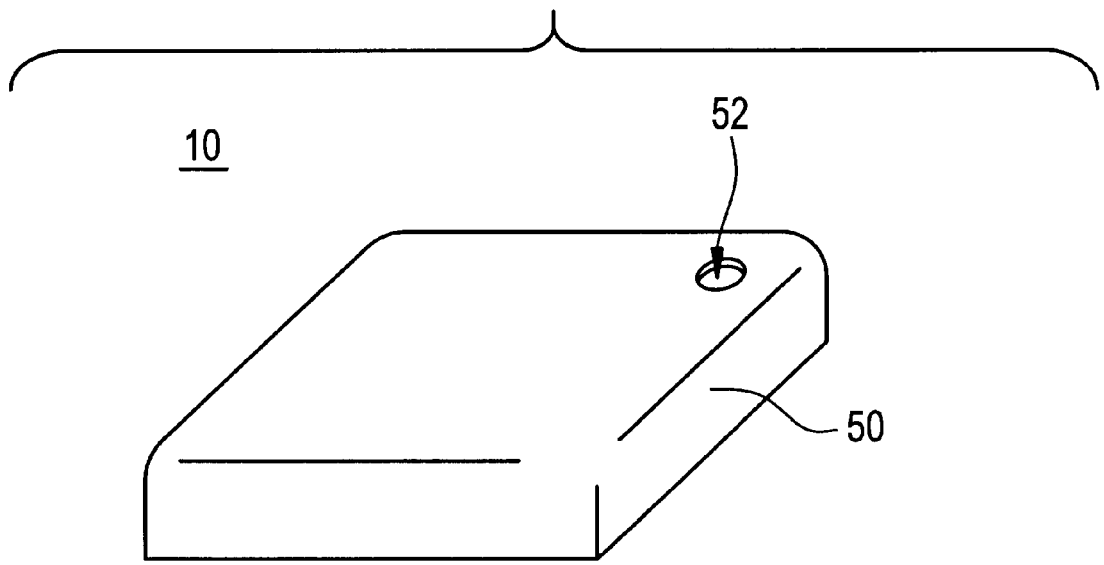
FIG. 2 is an exploded perspective view of the ladder filter shown in FIG. 1.
Figure 2:
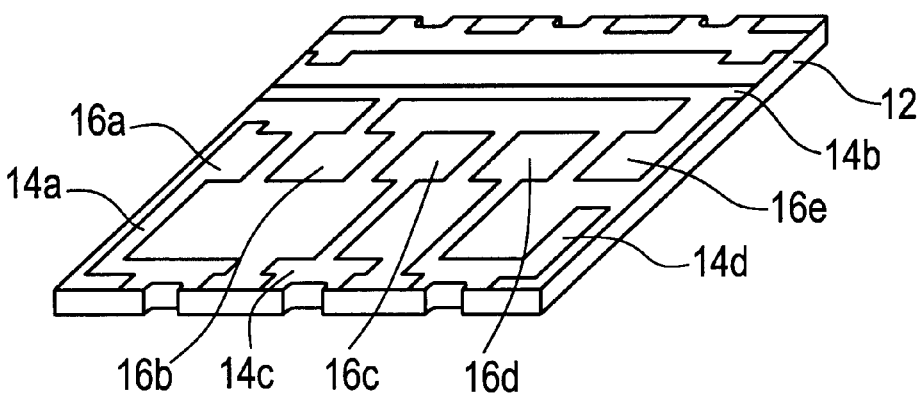
Figure 4:
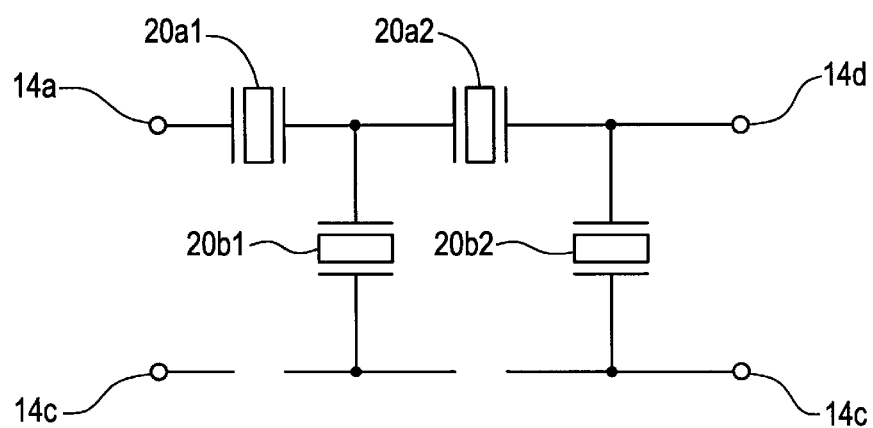
FIG. 4 is a circuit diagram of the ladder filter shown in FIG. 1.
Figure 5:
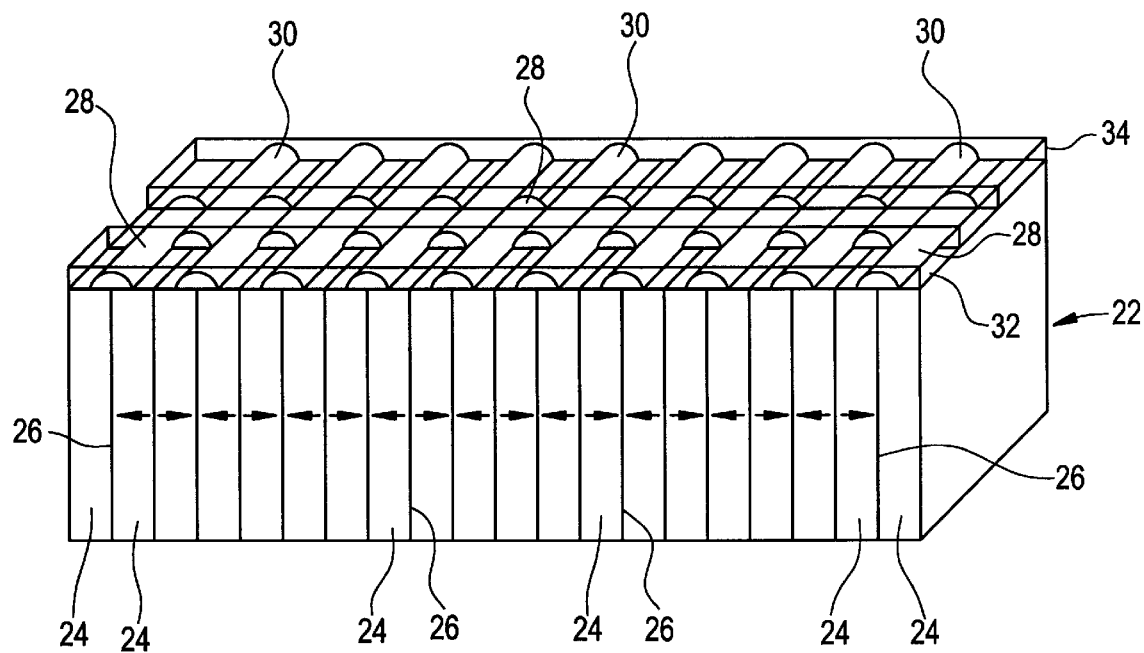
FIG. 5 is a diagram showing a piezoelectric resonator used in the ladder filter shown in FIG. 1.

FIG. 1 is a perspective view of a first preferred embodiment of a ladder filter in accordance with the present invention, FIG. 2 is an exploded perspective view of the ladder filter, FIG. 3 is a plan view of an essential portion of the ladder filter, and FIG. 4 is a circuit diagram of the ladder filter. FIG. 5 is a diagram showing a piezoelectric resonator used in the ladder filter shown in FIG. 1.

The ladder filter 10 shown in FIG. 1 includes an insulating substrate 12 in the form of, for example, a substantially rectangular plate. For example, a resin substrate such as a glass-epoxy resin substrate, or a ceramic substrate such as an alumina substrate may be used as the insulating substrate 12. Also, a multilayer substrate or a dielectric substrate may be used as the substrate 12.

On one major surface of the insulating substrate 12, four pattern electrodes 14a, 14b, 14c, and 14d are preferably arranged to be spaced apart from each other. Five lands 16a, 16b, 16c, 16d, and 16e are provided in a row and connected to the pattern electrodes 14a to 14d, respectively and are spaced apart from each other. In this case, the lands 16a to 16d are provided at ends of the pattern electrodes 14a to 14d while the land 16e is provided at another end of the pattern electrode 14b.

On the lands 16a to 16e of these pattern electrodes 14a to 14d, four piezoelectric resonators 20a1, 20b1, 20b2, and 20a2 are arranged in this order. Two piezoelectric resonators 20a1 and 20a2 are used as series resonators and preferably have the same structure. The other two piezoelectric resonators 20b1 and 20b2 are used as parallel resonators and preferably have the same structure. The resonators 20a1, 20b1, 20b2, 20a2 are designed so that the capacitances of the piezoelectric resonators 20b1 and 20b2 used as parallel resonators are much larger than the capacitances of the piezoelectric resonators 20a1 and 20a2 used as series resonators. Although the piezoelectric resonators 20a1 and 20a2 and the piezoelectric resonators 20b1 and 20b2 differ in length according to the difference in capacitance, their structures are preferably similar to each other. Therefore, only one piezoelectric resonator 20a1 will be described in detail.

The piezoelectric resonator 20a1 includes a base member 22 in the form of, for example, a substantially rectangular block which may, in one example, have the dimensions of about 4.2 mm×1 mm×1 mm, as shown in FIG. 5. The base member 22 includes, for example, a lamination of twenty piezoelectric layers 24 made of a piezoelectric ceramic material. The piezoelectric layers 24 are preferably the same size. The piezoelectric layers 24 are polarized along the longitudinal direction of the base member 22 so that the directions of polarization of each adjacent pair of the piezoelectric layers 24 are opposite to each other, as indicated by the arrows in FIG. 5.

Internal electrodes 26 are disposed between the twenty piezoelectric layers 24 of the base member 22. Thus, the internal electrodes 26 are arranged substantially perpendicularly to the longitudinal direction of the base member 22 while being spaced apart from each other in the longitudinal direction of the base member 22. Also, the internal electrodes 26 preferably extend over the major surfaces of the piezoelectric layers 24. Thus, the internal electrodes 26 are arranged so as to be exposed at the four side surfaces of the base member 22.

At one end of one side surface of the base member 22 in the width direction of the base member 22, exposed portions of the internal electrodes 26 in the side surfaces of the base member 22 are alternately covered with the insulating film 28 and left uncovered. At the other end of the base member 22 in the width direction, the exposed portions of the internal electrodes 26 opposite from those covered by the insulating film 28 are covered by an insulating film 30.

Also, at one end of the one side surface of the base member 22 in the width direction of the base member 22, an external electrode 32 is disposed along the longitudinal direction of the base member 22 over the insulating films 28 disposed on one of the two groups of internal electrodes 26 alternating with each other and other portions so as to be connected to the other group of alternate internal electrodes 26. At the other end of the side surface of the base member 22 in the width direction, an external electrode 34 is arranged along the longitudinal direction of the base member 22 over the insulating films 30 formed on the other group of alternate internal electrodes 26 and other portions so as to be connected to the former group of alternate internal electrodes 26.

In this piezoelectric resonator 20a1, the external electrodes 32 and 34 are used as input and output electrodes. An electric field is applied between each adjacent pair of internal electrodes 26 by supplying a signal to the external electrodes 32 and 34. The piezoelectric layers 24, except those at the opposite ends of the base member 22, are thereby made piezoelectrically active. Since in this arrangement, electric fields in opposite directions are applied to the piezoelectric layers 24 polarized in the opposite directions, the piezoelectric layers 24 contract and expand as a whole in single common direction. That is, an alternating electric field in the longitudinal direction of the base member 22 is applied to each piezoelectric layer 24 by the in terminal electrodes 26 connected to the external electrodes 32 and 34 to cause a contracting and expanding drive force in the piezoelectric layer 24 such that fundamental vibration of longitudinal vibration is excited in the piezoelectric resonator 20a1 with a node being located at an approximate center of the base member 22 in the longitudinal direction.

In this piezoelectric resonator 20a1, the direction of polarization of the piezoelectric layers 24, the directions of electric fields applied via an input signal and the direction of vibration of the piezoelectric layers 24 preferably coincide with each other. That is, this piezoelectric resonator 20a1 is preferably a stiffened type resonator. As a result, this piezoelectric resonator 20a1 has an electromechanical coefficient larger than that of unstiffened type piezoelectric resonators in which the direction of polarization and the direction of an electric field differ from the direction of vibration. Therefore, this piezoelectric resonator 20a1 has a large difference ΔF between a resonant frequency and an antiresonant frequency in comparison with unstiffened type piezoelectric resonators. As a result, this piezoelectric resonator 20a1 can have a large-bandwidth characteristic in comparison with unstiffened type piezoelectric resonators.

Further, in this piezoelectric resonator 20a1, the capacitance of the resonator can be adjusted, for example, by adjusting the opposed area of the internal electrodes 26, the number of piezoelectric layers 24 and the number of internal electrodes 26, or the size of the piezoelectric layers 24 in the longitudinal direction of the base member 22. That is, the capacitance of the resonator can be increased by increasing the opposed area of the internal electrodes 26, by increasing the numbers of the piezoelectric layers 24 and the internal electrodes 26, or by reducing the size of the piezoelectric layers 24 in the longitudinal direction of the base member 22. Conversely, the capacitance of the resonator can be reduced by reducing the opposed area of the internal electrodes 26, by reducing the numbers of the piezoelectric layers 24 and the internal electrodes 26, or by increasing the size of the piezoelectric layers 24 in the longitudinal direction of the base member 22. Thus, the capacitance can be adjusted by adjusting the opposed area of the internal electrodes 26, the numbers of the piezoelectric layers 24 and the internal electrodes 26, or the size of the piezoelectric layers 24 in the longitudinal direction of the base member 22, and the degree of freedom in capacitance design is high. Therefore, impedance matching with an external circuit can easily be achieved when the piezoelectric resonator 20a1 is mounted on a circuit board or the like.

In this ladder filter 10, a mount member 40 preferably made of an electroconductive paste or the like located at an approximate center in the longitudinal direction on the external electrode 32 of the piezoelectric resonator 20a1 provided as a first series resonator is bonded to the land 16a of the pattern electrode 14a via an electroconductive adhesive or the like (not shown) applied on the land 16a. The external electrode 32 of the piezoelectric resonator 20a1 is thereby connected to the pattern electrode 14a.

In the same manner, the external electrode 34 of the piezoelectric resonator 20a1 and the external electrode 32 of the piezoelectric resonator 20b1 used as a first parallel resonator are bonded to the land 16b of the pattern electrode 14b. The external electrode 34 of the piezoelectric resonator 20a1 and the external electrode 32 of the piezoelectric resonator 20b1 are thereby bonded to the pattern electrode 14b.

Further, the external electrode 34 of the piezoelectric resonator 20b1 and the external electrode 32 of the piezoelectric resonator 20b2 used as a second parallel resonator are bonded to the land 16c of the pattern electrode 14c. The external electrode 34 of the piezoelectric resonator 20b1 and the external electrode 32 of the piezoelectric resonator 20b2 are thereby bonded to the pattern electrode 14c.

Also, the external electrode 34 of the piezoelectric resonator 20b2 and the external electrode 32 of the piezoelectric resonator 20a2 used as a second series resonator are bonded to the land 16d of the pattern electrode 14d. The external electrode 34 of the piezoelectric resonator 20b2 and the external electrode 32 of the piezoelectric resonator 20a2 are thereby bonded to the pattern electrode 14d.

Further, the external electrode 34 of the piezoelectric resonator 20a2 is bonded to the land 16e of the pattern electrode 14b. The external electrode 34 of the piezoelectric resonator 20a2 is thereby bonded to the pattern electrode 14b.

Thus, this ladder filter 10 has the ladder type circuit shown in FIG. 4. That is, in this ladder filter 10, the pattern electrode 14a is used as an input terminal, the pattern electrode 14d is used as an output terminal, and the pattern electrode 14c is used as a ground terminal.

Further, in this ladder filter 10, a cap 50 preferably made of a metal is placed on and bonded to the insulating substrate 12 preferably via an adhesive formed of an insulating resin or the like so as to cover the piezoelectric resonators 20a1, 20a2, 20b1, and 20b1. In this case, an insulating resin is applied on the pattern electrodes 14a to 14d to prevent conduction between the cap 50 and the pattern electrodes 14a to 14d. Also, an air hole 52 is formed preferably in an upper portion of the cap 50.

In this ladder filter 10, since the air hole 52 is formed in the cap 50, condensation does not occur on the surfaces of the piezoelectric resonators and other elements contained therein even if water vapor enters inside the cap 50. Therefore, when the ladder filter 10 is mounted by reflow soldering, the pressure inside the cap 50 is not increased, a force lifting the cap 50 off of the substrate is not produced, and the cap 50 is not dislodged from the substrate.

In this ladder filter 10, the adjacent two of the external electrodes of each adjacent pair of the piezoelectric resonators are connected to one pattern electrode. Therefore, there is no need for insulation between the two external electrodes, and each adjacent pair of the piezoelectric resonators can be positioned closer to each other, thus enabling ladder filter to be reduced in size.

Further, in this ladder filter 10, each of the piezoelectric resonators is supported by the mount member located at a node of each resonator such that vibration portions of the resonators are freely floating over the insulating substrate, so that vibration of the piezoelectric resonator is not damped.

The amount of attenuation in the ladder filter depends upon the capacitance ratio of the series resonators and the parallel resonators. In this ladder filter 10, the capacitance of each piezoelectric resonator can be adjusted by changing the opposed area of the internal electrodes 26, the number of piezoelectric layers 24 and the number of internal electrodes 26, or the size of the piezoelectric layers 24 in the longitudinal direction of the base member 22. Therefore, a ladder filter having a large amount of attenuation can be realized while limiting the number of resonators. Moreover, because the range of selection of ΔF can be increased, a ladder filter having a wider passband can be provided.

In the above-described ladder filter 10, the air hole 52 is preferably provided in an upper portion of the cap 50. According to other preferred embodiments of the present invention, however, the air hole 52 may be formed in a side portion of the cap 50. In particular, if a central portion of the cap 50 is adhered to a resonator contained therein, it is preferable to form the air hole 52 at a corner portion of the cap 50. The effect of the air hole 52 formed in a side portion of the cap 50 is the same as that of the air hole 52 formed in an upper portion of the cap 50. A plurality of air holes 52 may be formed in the cap 50 instead of only one air hole 52.

In each of the piezoelectric resonators used in the above-described ladder filter 10, two external electrodes 32 and 34 are provided on one surface of the base member 22. According to preferred embodiments of the present invention, however, two external electrodes 32 and 34 of the piezoelectric resonator may be respectively provided on two opposite side surfaces of the base member 22. In such a case, one side surface on which external electrodes 32 and 34 are not provided is opposed to one major surface of insulating substrate 12, and two external electrodes 32 and 34 are connected to pattern electrodes via an electroconductive adhesive.

In each of the above-described piezoelectric resonators, portions at the opposite ends in the longitudinal direction of the base member 22 are piezoelectrically inactive. Alternatively, portions other than the opposite end portions may alternatively be piezoelectrically inactive portions, or the base member 22 can be piezoelectrically active along the entire length in the longitudinal direction.

Figure 6:
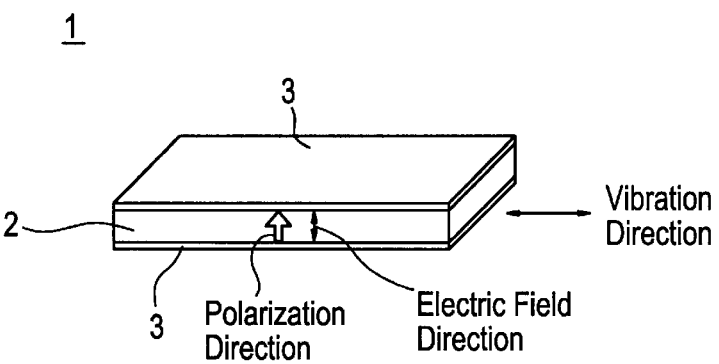
FIG. 6 is a perspective view of another example of the piezoelectric resonator used in the ladder filter shown in FIG. 1.

Further, according to preferred embodiments of the present invention, a piezoelectric resonator such as that shown in FIG. 6 may be used. FIG. 6 shows another example of the piezoelectric resonator. A piezoelectric resonator 1 includes a piezoelectric material substrate 2 having, for example, the shape of a substantially rectangular plate. The piezoelectric material substrate 2 is polarized in the direction of thickness. Electrodes 3 are disposed on two surfaces of the piezoelectric material substrate 2. By applying a signal between the electrodes 3, an electric field is applied along the thickness direction of the piezoelectric material substrate 2 to cause the piezoelectric material substrate 2 to vibrate in the longitudinal direction. This piezoelectric resonator is an unstiffened type in which the direction of an electric field and the direction of polarization differ from the direction of vibration. Therefore, the unstiffened type of piezoelectric resonator has an electromechanical coefficient that is smaller than that of a piezoelectric resonator of a stiffened type in which the direction of an electric field and the direction of polarization coincide with the direction of vibration. The unstiffened type piezoelectric resonator therefore has a comparatively small difference ΔF between a resonant frequency and an antiresonant frequency. This means that the bandwidth is small if the piezoelectric resonator is used as a filter. Thus, the unstiffened type piezoelectric resonator differs from the piezoelectric resonator 20a1 of the laminated structure shown in FIG. 5 in that the degree of freedom in characteristic design of an electronic component such as a filter using the piezoelectric resonator is low. For example, when used, this piezoelectric resonator 1 is arranged so that a side surface of the piezoelectric material substrate 2 of the piezoelectric resonator 1 faces one major surface of the insulating substrate 12, thereby enabling the two electrodes 3 of the piezoelectric resonator 1 to be connected to the corresponding pattern electrodes via an electroconductive resin.

Any other piezoelectric resonator capable of being mounted in a surface mount manner may be used in the ladder filter in accordance with preferred embodiments of the present invention.

In the ladder filter in accordance with preferred embodiments of the present invention, the number of piezoelectric resonators may be changed as desired.

The present invention is also applicable to other electronic components having piezoelectric resonators, e.g., oscillators and other kinds of filters and in the same manner as it is applied to a ladder filter.

Figure 7:
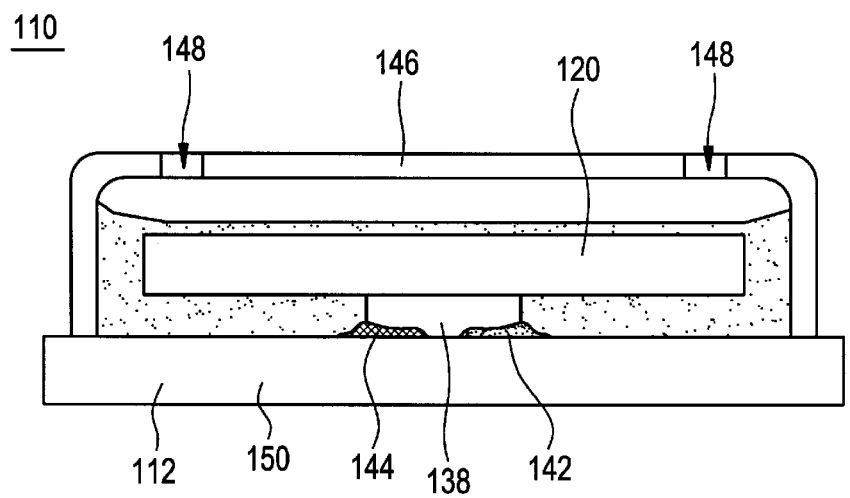
FIG. 7 is a diagram showing a first preferred embodiment of a piezoelectric component of the present invention.
Figure 8:
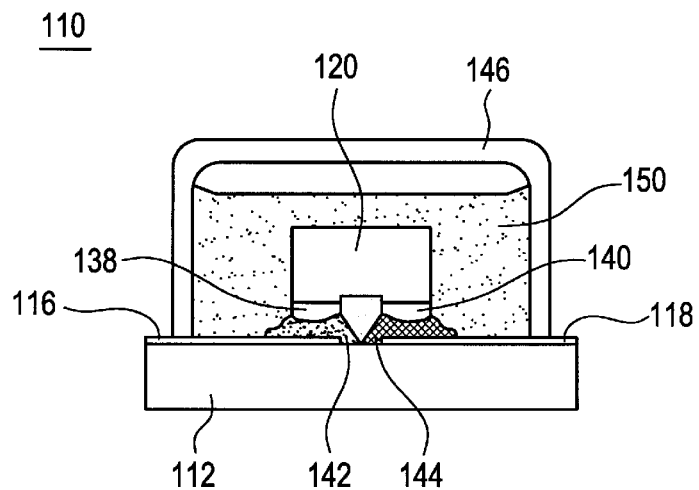
FIG. 8 is a diagram of the piezoelectric component shown in FIG. 7 viewed in a different direction.
Figure 9:
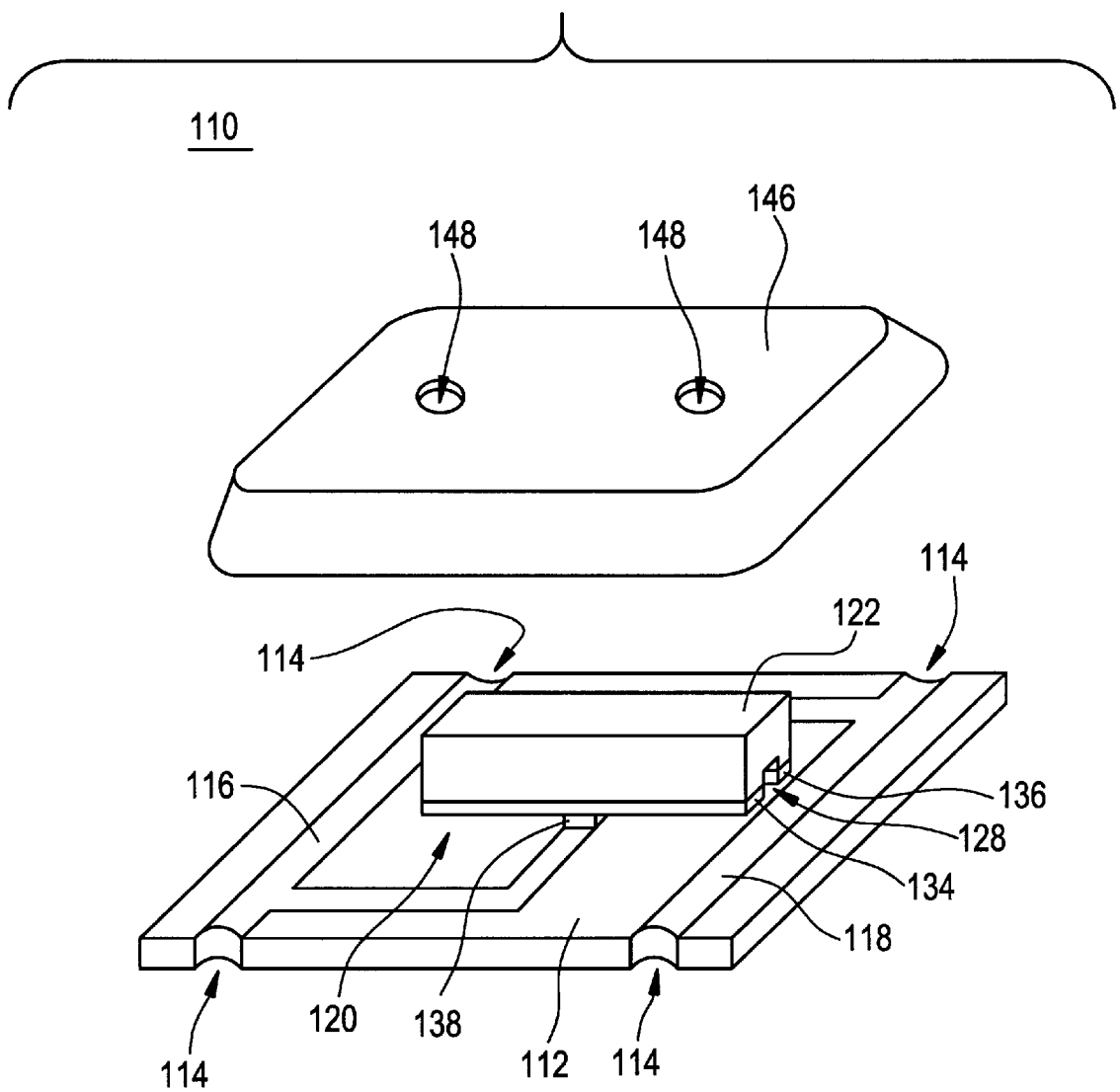
FIG. 9 is an exploded perspective view of the piezoelectric component shown in FIG. 7.

FIG. 7 is a diagram showing a second preferred embodiment of a piezoelectric component in accordance with the present invention, and FIG. 8 is a diagram of this piezoelectric component viewed in another direction. The piezoelectric component 110 includes a substrate 102. As shown in FIG. 9, two pairs of holes 114 are preferably provided at opposite end portions of the substrate 112. Two pattern electrodes 116 and 118 are preferably disposed on one surface of the substrate 112. One pattern electrode 116 is disposed between opposite holes 114 so as to have a substantially L-shaped extension extending from one end portion toward an approximate central portion of the substrate 112. The other pattern electrode 118 is disposed between the other holes 114 so as to have a substantially L-shaped extension extending from the opposite end portion toward the approximate central portion of the substrate 112. The two pattern electrodes 116 and 118 are arranged to be spaced from each other about the central portion of the substrate 112 and so as to face each other.

Figure 10:
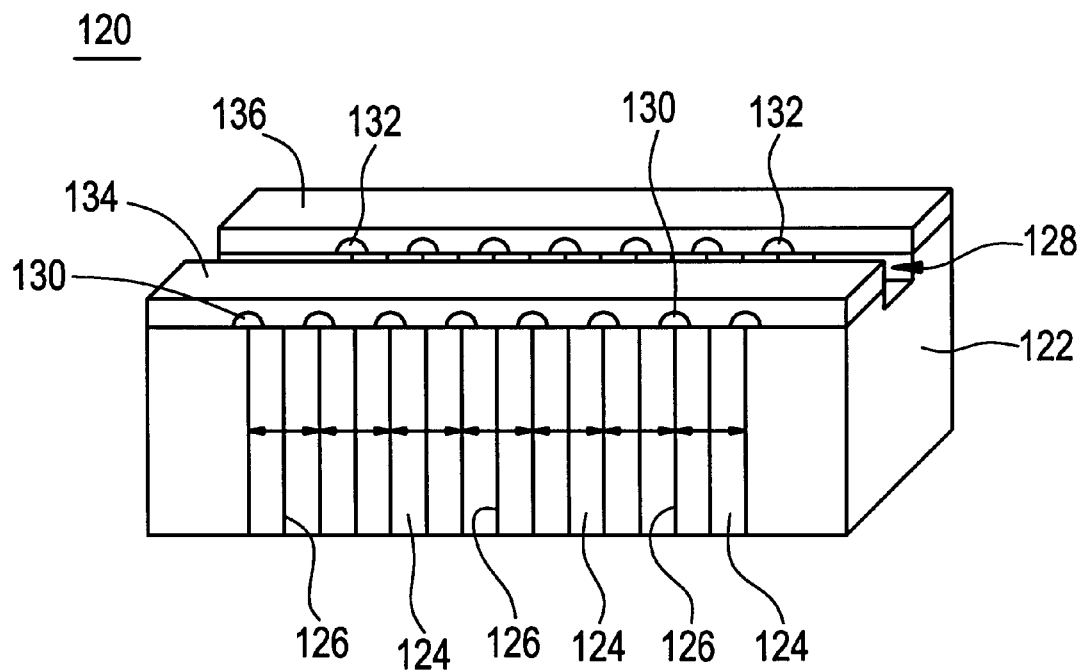
FIG. 10 is a diagram showing an example of a piezoelectric resonator used in the piezoelectric component shown in FIG. 7.

A piezoelectric resonator 120 is mounted on the substrate 112. The piezoelectric resonator 120 includes a base member 122 having a substantially rectangular shape as shown in FIG. 10. The base member 122 has a structure in which a plurality of piezoelectric layers 124 and inner electrodes 126 are laminated. The piezoelectric layers 124 and the inner electrodes 126 are arranged so that the surfaces thereof are substantially perpendicular to the longitudinal direction of the base member 122. The piezoelectric layers 124 are polarized along the longitudinal direction of the base member 122 so that the directions of polarization of each adjacent pair of the piezoelectric layers 124 are opposite from each other, as indicated by the arrows in FIG. 10. However, opposite end portions of the base member 122 are preferably not polarized.

Figure 11:
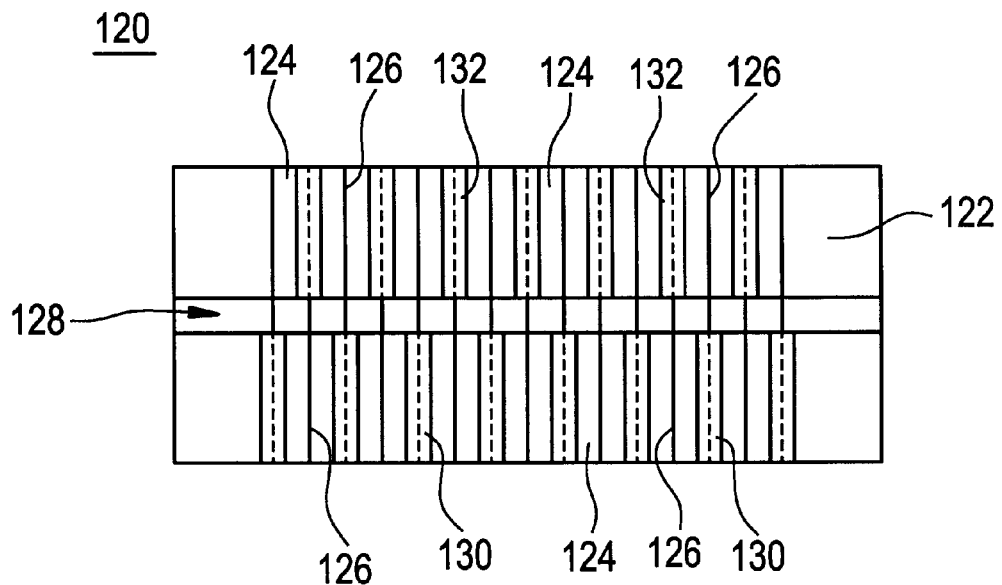
FIG. 11 is a plan view showing a state of insulating films disposed on the piezoelectric resonator shown in FIG. 10.

A groove 128 extending in the longitudinal direction of the base member 122 is formed in one side surface of the base member 122. The groove 128 is preferably provided at an approximate center in the width direction of the base member 122 to divide the one side surface into two. As shown in FIG. 11, first and second insulating films 130 and 132 are provided on the side surfaces divided by the groove 128. Exposed portions of the electrodes 126 in one of the side surfaces of the base member 122 divided by the groove 128 are alternately covered with the first insulating film 130 and left uncovered. The electrodes 126 not covered by the first insulating film 130 at the above-mentioned one of the side surfaces divided by the groove 128 have their portions covered with the second insulating film 132 on the other of the side surfaces divided by the groove 128.

Further, external electrodes 134 and 136 are provided over the portions of the base member 122 on which the first and second insulating films 130 and 132 are provided, i.e., on the opposite sides of the groove 128. In this manner, the electrodes 126 not covered with the first insulating film 130 are connected to the external electrode 134 while the electrodes 126 not covered with the second insulating film 132 are connected to the external electrode 136. That is, each adjacent pair of the electrodes 126 are respectively connected to the external electrode 134 and the external electrode 136.

Figure 12:
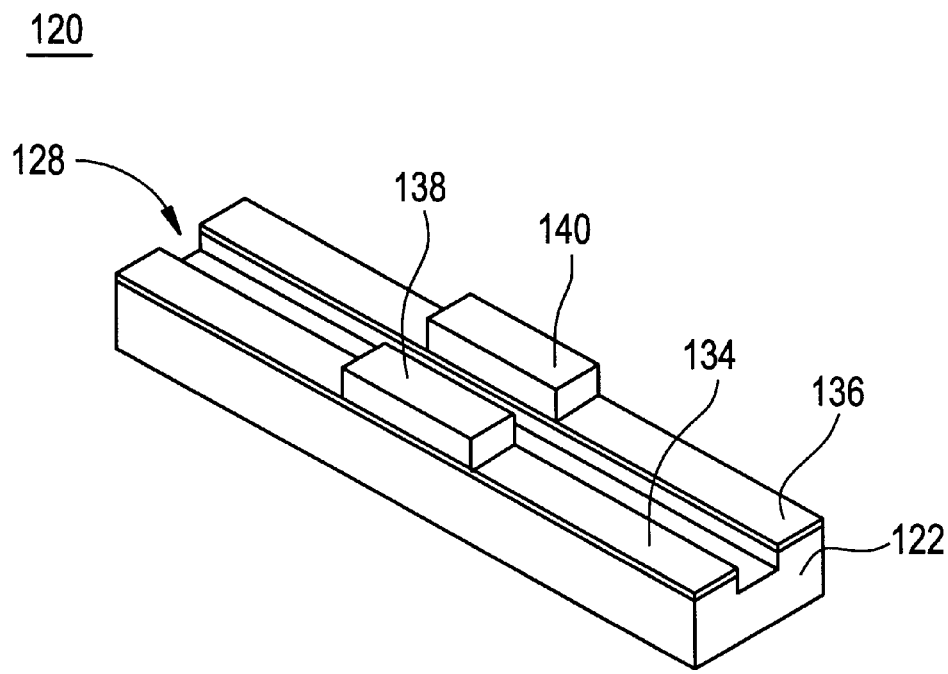
FIG. 12 is a perspective view showing a state where supporting members are disposed on the piezoelectric resonator shown in FIG. 10.

As shown in FIG. 12, supporting members 138 and 140 are provided on the external electrodes 134 and 136 at an approximate center in the longitudinal direction of the base member 122. Each of the supporting members 138 and 140 is formed of an electroconductive material such as a conductive paste so as to have the shape of a substantially rectangular block and so as to have a width that is approximately equal to that of the external electrodes 134 and 136. The supporting member 138 is connected to the pattern electrode 16 via electroconductive adhesive 142 at its one end in the longitudinal direction of the base member 122 and is fixed on the pattern electrode 116 by the insulating adhesive 144 at the other end. On the other hand, the supporting member 140 is fixed on the pattern electrode 118 by the insulating adhesive 144 at its one end in the longitudinal direction of the base member 122 and is bonded to the pattern electrode 118 by electroconductive adhesive 142 at the other end. Consequently, electroconductive adhesive 142 and insulating adhesive 144 are placed side by side along adjacent portions of the supporting members 138 and 140, as shown in FIG. 8, thereby preventing electrical connection between the adjacent supporting members 138 and 140 even if adhesives 142 and 144 spread between the supporting members 138 and 140 when the piezoelectric resonator 120 is mounted on the substrate 112.

The substrate 112 is covered with a cap 146 so as to cover the piezoelectric resonator 112. The cap 146 preferably has holes 148 provided in at least two places, for example. In the state where the substrate 112 is covered with the cap 146, a rubber-like elastic material 150 is injected through one of the holes 148. For example, a silicone resin is used as rubber-like elastic material 150. Rubber-like elastic material 150 is injected for filling around the piezoelectric resonator 120. This piezoelectric component 110 is used as an oscillator, a discriminator or the like.

In this piezoelectric component 110, a signal is input between the pattern electrodes 116 and 118. Electric fields are applied to the piezoelectric layers 124 of the base member 122 polarized in opposite directions by the application of the input signal to cause the piezoelectric layers to expand and contract as a whole in single common direction. Fundamental vibration of longitudinal vibration is thereby excited through the piezoelectric resonator 120 with a node corresponding to an approximate central portion of the base member 122.

The piezoelectric resonator 120 used in this piezoelectric component 110 is preferably a stiffened type in which the direction of polarization, the directions of electric fields and the direction of vibration coincide with each other. Therefore, the piezoelectric resonator 120 has a large electromechanical coefficient and a large difference ΔF between a resonant frequency and an antiresonant frequency in comparison with a piezoelectric resonator of an unstiffened type in which the direction of polarization and the direction of an electric field differ from the direction of vibration. Therefore, if this piezoelectric resonator 20 is used as a filter or oscillator, the bandwidth can be increased. In this piezoelectric component 110, a nodal portion of the piezoelectric resonator 120 can be supported since the supporting members 138 and 140 are located at the approximate center in the longitudinal direction of the base member 122, thereby avoiding any hindrance or effect on vibration of the piezoelectric resonator 120.

In this piezoelectric component 110, vibration of the piezoelectric resonator 120 may preferably be constrained by rubber-like elastic material 150. The electromechanical coefficient Qm of the piezoelectric resonator 120 is thereby adjusted by the presence of the elastic material 150. It is possible to adjust the electromechanical coefficient Qm of the piezoelectric resonator 120 to a desired value by suitably selecting the Young's modulus of the rubber-like elastic material. In this piezoelectric component 110, the rubber-like elastic material 150 is preferably provided as a filler around the piezoelectric resonator 120. Therefore, the state of adhesion of the rubber-like elastic material to the piezoelectric resonator 120 is made uniform between a plurality of piezoelectric components 110. As a result, variation in Qm between a plurality of piezoelectric components 10 is significantly reduced.

Figure 13:
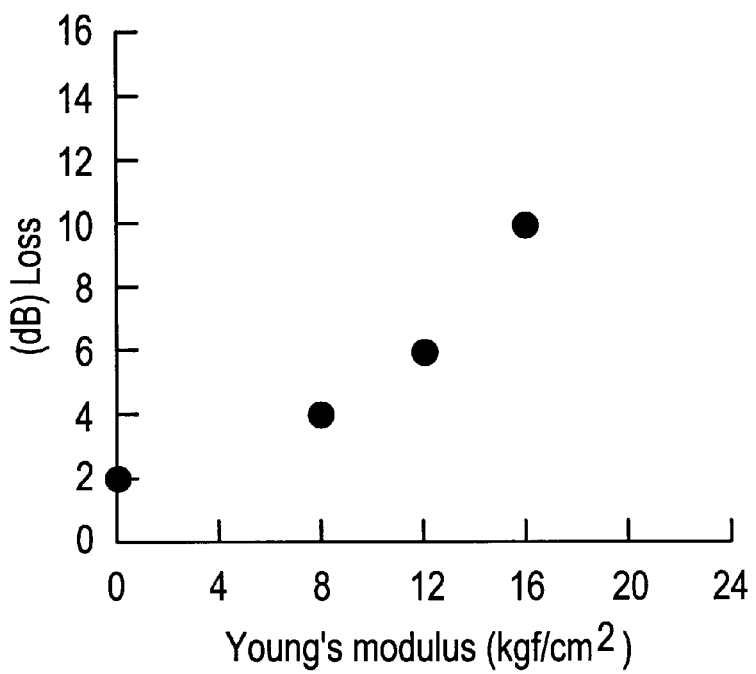
FIG. 13 is a graph showing the relationship between the Young's modulus of a rubber-like elastic material and a loss in the piezoelectric component shown in FIG. 7.

FIG. 13 shows the relationship between the Young's modulus of rubber-like elastic material 150 and the loss in the piezoelectric component 110. The piezoelectric component 110 has a practical range of loss which is less than about 6 dB and it is preferable to set the Young's modulus of the rubber-like elastic material 150 to about 12 kg/cm$^2$ or less. That is, a piezoelectric component 110 having a desired characteristic can be obtained by selecting the Young's modulus of the rubber-like elastic material 150 in the range not exceeding about 12 kgf/cm$^2$.

Since in such a piezoelectric component 110 the periphery of the piezoelectric resonator 120 is covered with the rubber-like elastic material 105, a moisture-proof property of the product itself can be improved by using a silicone resin having an improved moisture-proof effect. Since the rubber-like elastic material 150 is injected through the hole 148 of the cap 146, the material 150 cannot enter a gap between the substrate 112 and the cap 146. Therefore, there is no need to manufacture a large substrate such as that provided for conventional piezoelectric components which enlarge the substrate by an amount equal to the area through which the rubber-like elastic material 150 spreads, and it is possible to reduce the greatly size of the substrate 112. Therefore, the size of the piezoelectric component 110 itself is significantly reduced.

Figure 14:
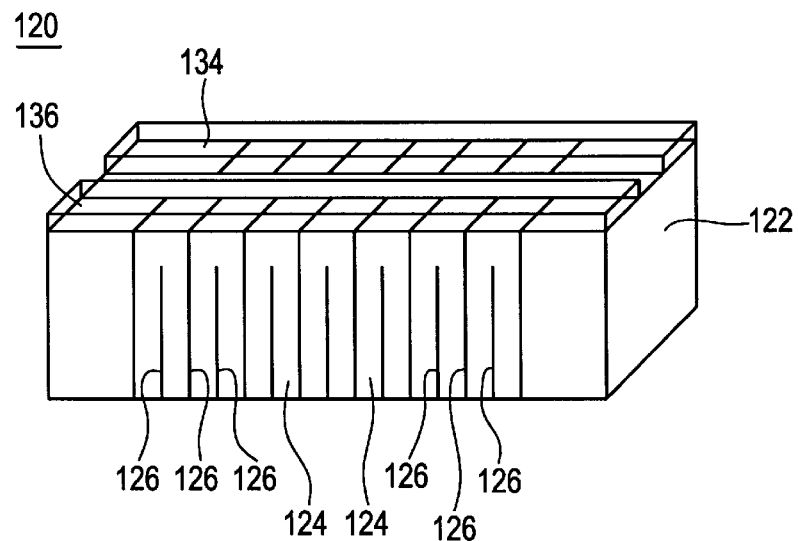
FIG. 14 is a diagram showing another example of the piezoelectric resonator used in the piezoelectric component of preferred embodiments of the present invention.
Figure 15:
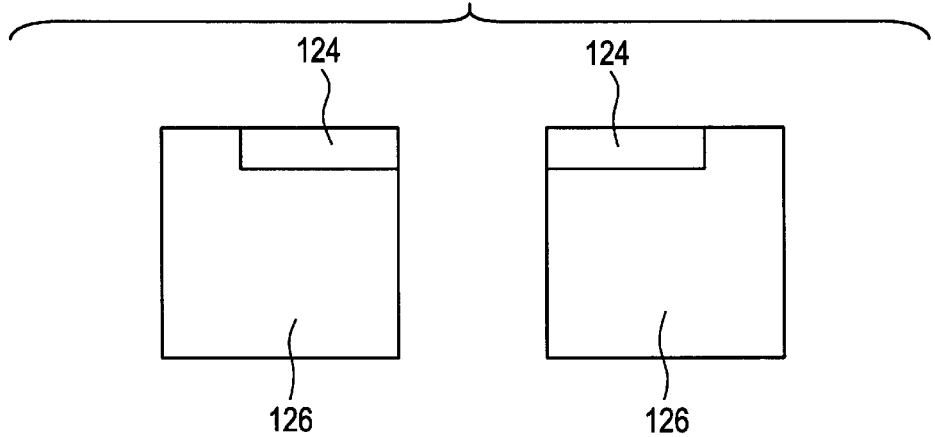
FIG. 15 is a plan view showing the relationship between piezoelectric layers and electrodes used in the piezoelectric component shown in FIG. 14.

As piezoelectric resonator 120 for use in such a piezoelectric component 110, a resonator having a structure such as that shown in FIG. 14 may be used. As shown in FIG. 15, each of inner electrodes 126 of this piezoelectric resonator 120 is generally L-shaped such that, at one side surface of a base member 122, portions of the inner electrodes 126 to be connected to external electrodes 134 and 136 are exposed while other portions of the inner electrodes 126 at the same side surface of the base member 122 are not exposed. The inner electrodes 126 formed in this manner are superposed one on another and external electrodes 134 and 136 are formed on the exposed portions of the inner electrodes 126 in one side surface of the base member 122. There is no need to form insulating films 130 and 132 on the piezoelectric resonator 120 constructed in this manner.

Figure 16:
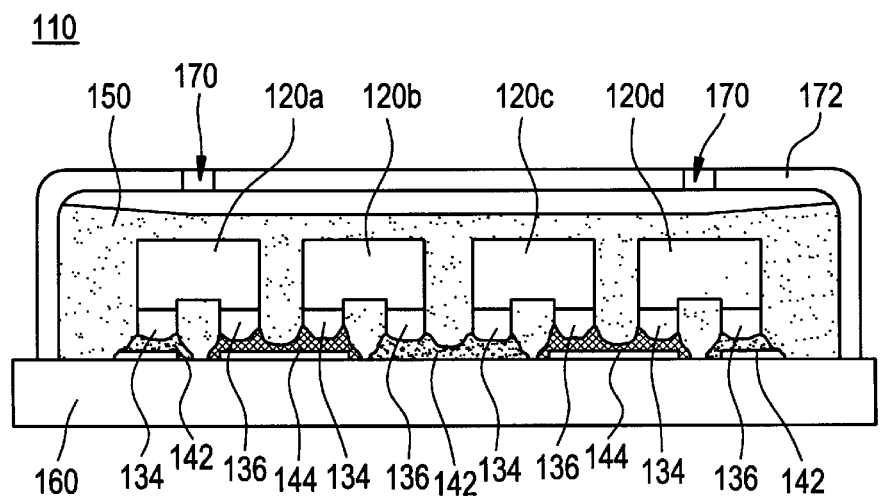
FIG. 16 is a diagram showing an example of a ladder filter according to a preferred embodiment of the present invention using a plurality of piezoelectric resonators.
Figure 17:
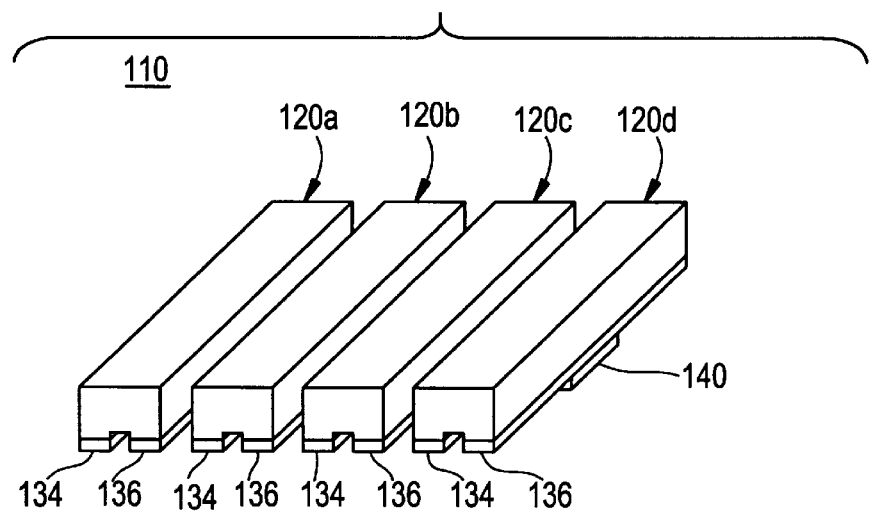
FIG. 17 is an exploded perspective view of the piezoelectric component shown in FIG. 16, showing the component without a cap.
Figure 17:
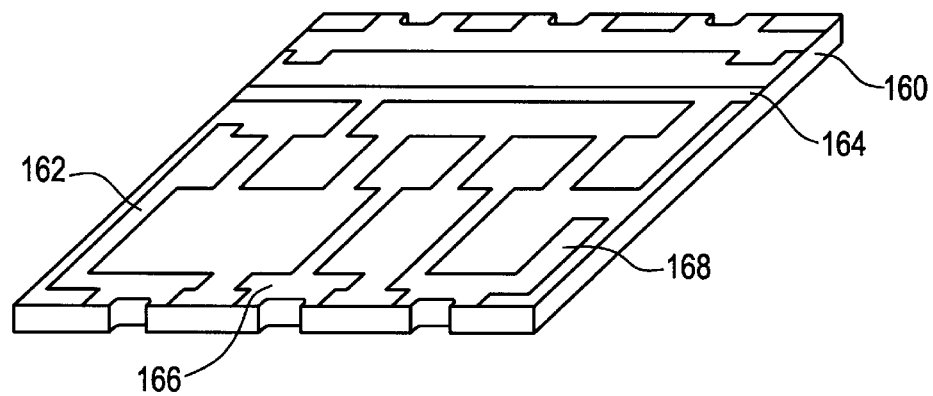

A piezoelectric component 110 may use a plurality of piezoelectric resonators 120. FIG. 16 is a diagram showing an example of a piezoelectric component used as a ladder filter having a ladder type circuit. In this piezoelectric component 110, as shown in FIG. 17, four pattern electrodes 162, 164, 166, and 168 are disposed on a substrate 160. In these pattern electrodes 162, 164, 166, and 168, five lands are provided, which are arranged in a row while being spaced from each other. In this example, the first land as seen from one end of the substrate 160 is provided in the pattern electrode 162, the second and fifth lands are provided in the pattern electrode 164, the third land is provided in the pattern electrode 166, and the fourth land is provided in the pattern electrode 168.

Supporting members 138 and 140 provided in these lands on external electrodes 134 and 136 of the piezoelectric resonators 120a, 120b, 120c, and 120d are bonded by electroconductive adhesive 142 and insulating adhesive 144. Since there is no problem even if electrical conduction is caused between the supporting members of each adjacent pair of the piezoelectric resonators located on the same land, electroconductive adhesive 142 and insulating adhesive 144 are placed so as to avoid conduction between different ones of the lands. The substrate 160 is thereafter covered with a cap 172 having a hole 170, and rubber-like elastic material 150 is injected for filling an area around the piezoelectric resonators 120a to 120d.

Figure 18:
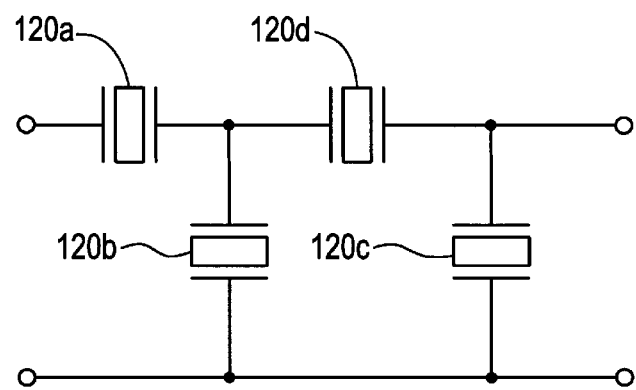
FIG. 18 is a circuit diagram of the piezoelectric component shown in FIG. 10.

This piezoelectric component 110 is used as a ladder filter having a ladder type circuit such as shown in FIG. 18. For example, in such a case, two piezoelectric resonators 120a and 120d are used as series resonators while the other piezoelectric resonators 120b and 120c are used as parallel resonators. Such a ladder filter is designed so that the capacitances of the parallel piezoelectric resonators 120b and 120c are larger than those of the series piezoelectric resonators 120a and 120d.

Also in such a piezoelectric component 110, rubber-like elastic material is provided for filling an area around the piezoelectric resonators 120a to 120d to uniformly fill the space around the piezoelectric resonators 120a to 120d, thereby obtaining a desired Qm. As a result, variations in characteristics of piezoelectric components 110 can be greatly reduced. Since rubber-like elastic material 150 is injected through the hole 170 formed in the cap 172 attached to the substrate 160, there is no need to enlarge the substrate by an amount of the area through which rubber-like elastic material 150 spreads, and the piezoelectric component 110 can therefor be greatly reduced in size.

The number of holes of the cap is not limited to two. Only one hole may be formed in the cap. If two holes are provided, the rubber-like elastic material is injected through one of them and the other can be used as an air hole. If only one hole is provided, this hole is used both for injection and for air release in such a manner that a thin nozzle is inserted through the hole to inject the rubber-like elastic material. The hole may be closed with a resin material or solder after the injection of the rubber-like elastic material. However, since the piezoelectric resonator is covered with the rubber-like elastic material, the moisture-proof effect is high and the hole may be left open.

In the above-described piezoelectric component 110, a laminated piezoelectric resonator is used. Alternatively, a piezoelectric resonator having an unstiffened type structure in which electrodes are disposed on the two faces of a piezoelectric material substrate may be used. That is, the effect of the present invention can be achieved by covering the periphery of a piezoelectric resonator with a rubber-like elastic material no matter what the kind of the piezoelectric resonator.

Figure 19:
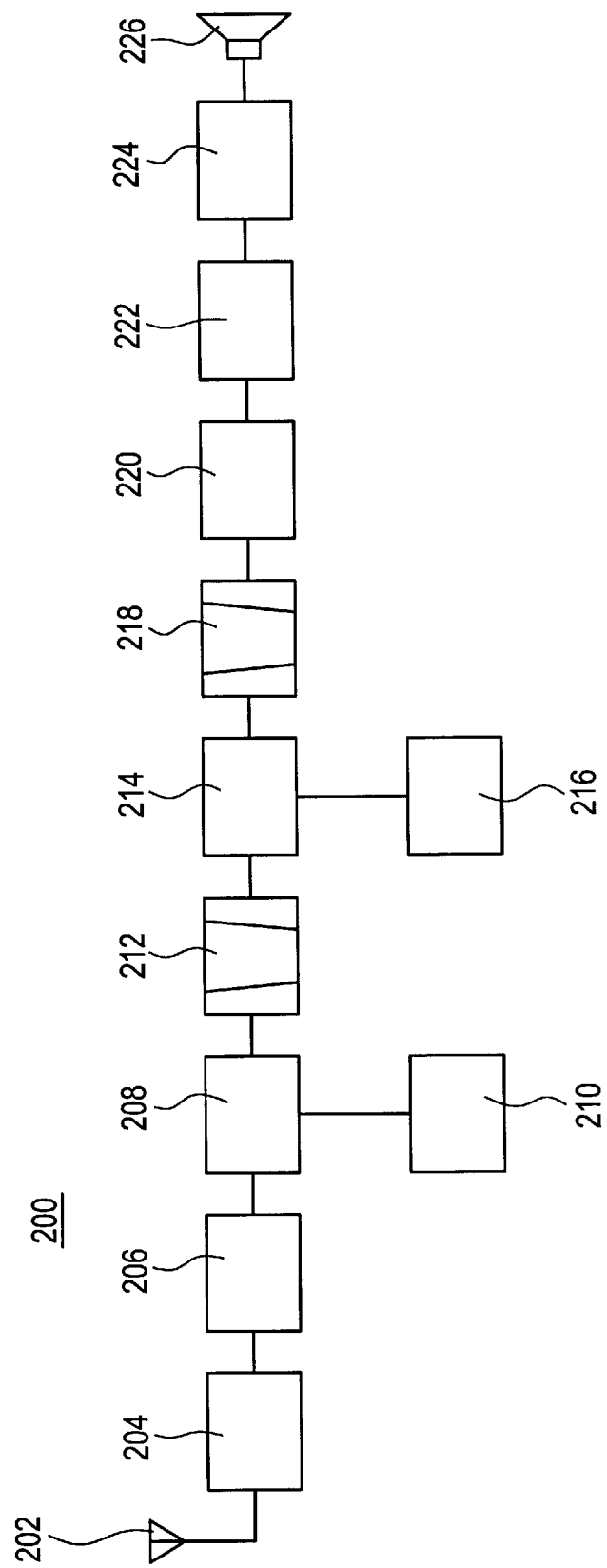
FIG. 19 is a block diagram illustrating a preferred embodiment of a double-super-heterodyne receiver according to the present invention.
Figure 20:
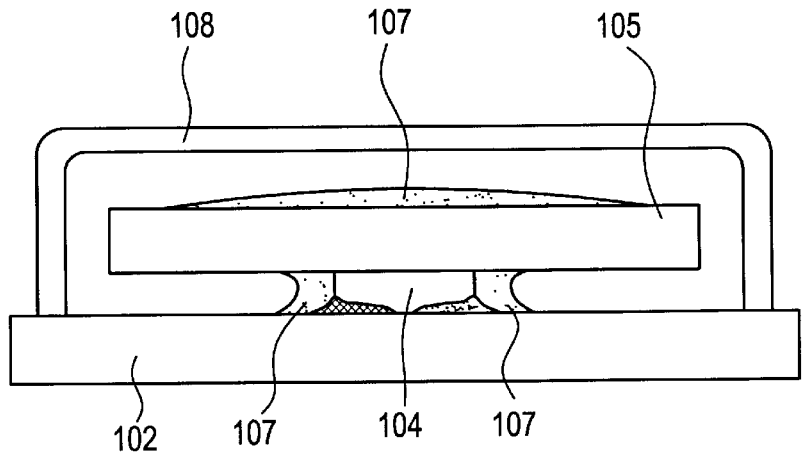
FIG. 20 is a diagram showing an example of a piezoelectric component constituting the background of the present invention.
Figure 21:
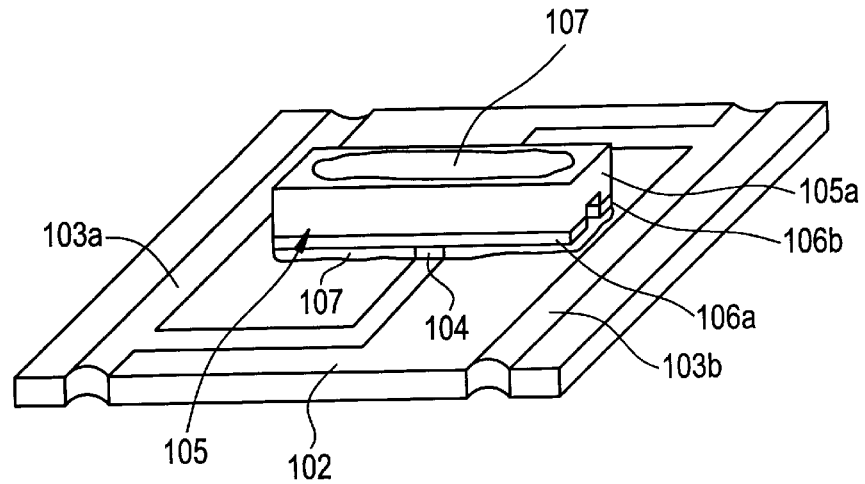
FIG. 21 is an exploded perspective view of the piezoelectric component constituting the background of the present invention and shown in FIG. 20.
Figure 22:
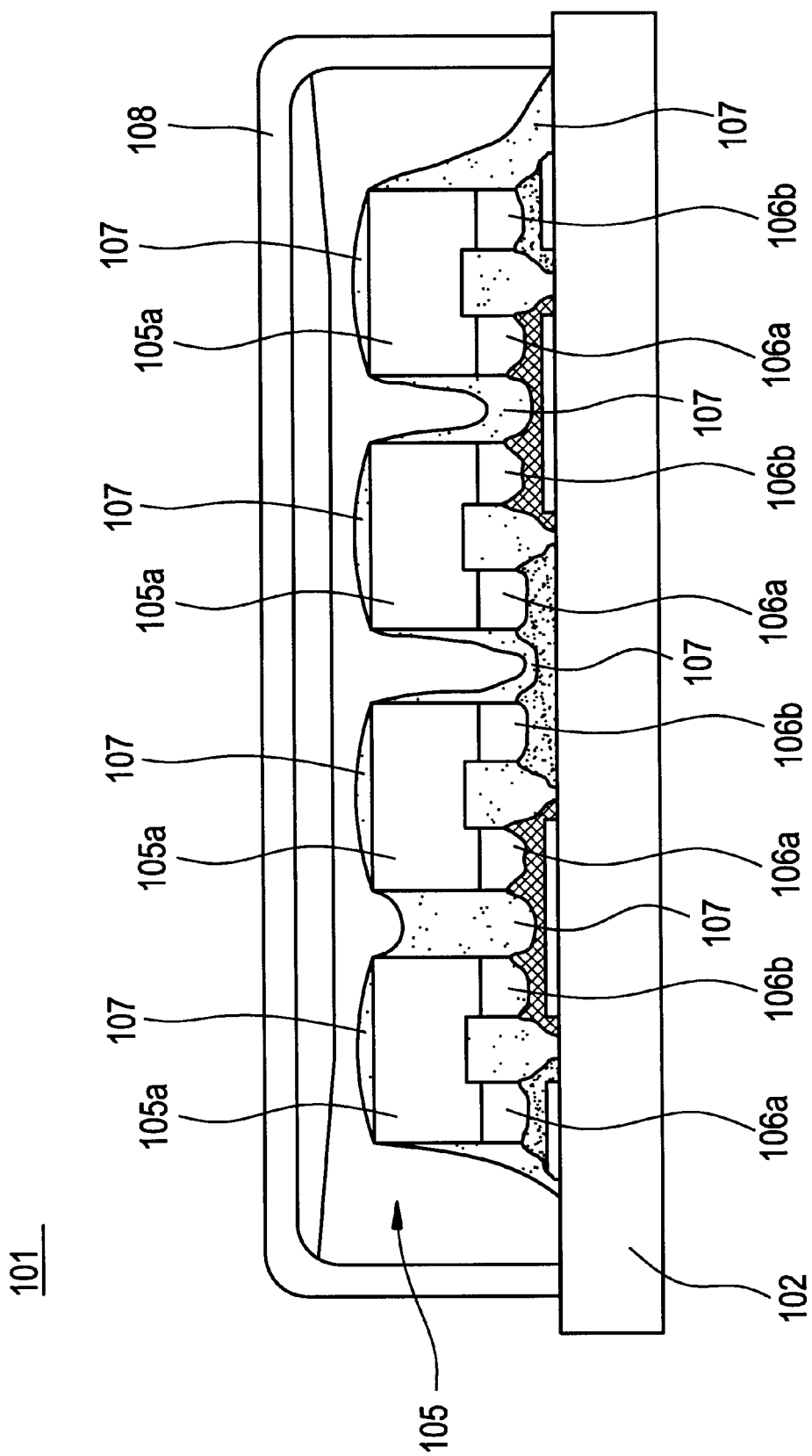
FIG. 22 is a diagram showing an example of a ladder filter which is a piezoelectric component constituting the background of the present invention, and which uses a plurality of piezoelectric resonators.

FIG. 19 is a block diagram showing another preferred embodiment of a communication apparatus, for example, a double-super-heterodyne receiver in accordance with the present invention. The super-heterodyne receiver 200 shown in FIG. 19 includes an antenna 202. The antenna 202 is connected to an input-end of an input circuit 204. The input circuit 204 performs an impedance matching between the antenna 202 and a high frequency amplifier 206 which will be described below.

A tuning circuit which selects a desired frequency or band-pass filter is preferably used as the input circuit 204. An output end of the input circuit 204 is connected to an input end of a high frequency amplifier 206. The high frequency amplifier 206 is used for improving a sensitivity by low-noise amplifying radio waves and for improving selectivity of image frequencies. An output end of the high frequency amplifier 206 is connected to an input end of a first frequency mixer 208. The first frequency mixer 208 is used for making a first integrated or differential intermediate frequency by mixing a desired frequency and a first local oscillation frequency. The other input end of the first frequency mixer 208 is connected to an output end of a first local oscillator 210. The first local oscillator 210 is used for oscillating the first local oscillation frequency to make the first intermediate frequency. An output end of the first frequency mixer 208 is connected to an input end of a first band pass filter 212. The first band-pass filter 212 is used for passing the first intermediate frequency. An output end of the first band pass filter 212 is connected to one input end of a second frequency mixer 214. The second frequency mixer 214 is used for making a second integrated or differential intermediate frequency by mixing the first intermediate frequency and a second local oscillation frequency. The other input end of the second frequency mixer 214 is connected to an output end of a second local oscillator 216. The second local oscillator 216 is used for oscillating the second local oscillation frequency to make the second intermediate frequency. An output end of the second frequency mixer 214 is connected to an input end of a second band pass filter 218. The second band pass filter 218 is used for passing the second intermediate frequency. An output end of the second band pass filter 218 is connected to an input end of an intermediate frequency amplifier 220. The intermediate frequency amplifier 220 is used for amplifying the second intermediate frequency. An output end of the intermediate frequency amplifier 220 is connected to an input end of a detector 222. The detector 222 is connected to an input end of a detector 222. The detector 222 is used for obtaining signal waves from the second intermediate frequency. An output end of the second detector 222 is connected to an input end of a low frequency amplifier 224. The low frequency amplifier 224 is used for amplifying the signal waves so that the signal waves can drive a speaker. An output end of the low frequency amplifier 224 is connected to a speaker 226.

In the present invention, the above-described piezoelectric resonator according to various preferred embodiments can be used as the detector 224 in the double-super-heterodyne receiver 200. The above-described ladder filter according to preferred embodiments can be used as each of the first band-pass filter 208 and the second band-pass filter 214 in the super-heterodyne receiver 200. Such a receiver 200 has a very small size and yet still achieves excellent receiving characteristics.

In the present invention, the above-described piezoelectric resonator according to preferred embodiments can be used as a detector in a single-super-heterodyne receiver. Further, the above described ladder filter according to preferred embodiments can be used as a band-pass filter. Similar to the above-described double-super-heterodyne receiver, such a single-super-heterodyne receiver has a very small size and achieves excellent receiving characteristics.

While the invention has been particularly shown and described with reference to preferred embodiments thereof, it will be understood by those skilled man in the art that the forgoing and other changes in form and details may be made therein without departing from the spirit of the invention.

What is claimed is:

1. An electronic component comprising:
    a substrate;
    a pattern electrode disposed on said substrate;
    a piezoelectric resonator provided on said substrate and connected to said pattern electrode;
    a cap provided on said substrate so as to cover said piezoelectric resonator and define a space inside said cap; and
    an elastic material disposed in said space inside of said cap to cover a periphery of said piezoelectric resonator;
    wherein at least one hole extending from said space inside said cap to outside of said cap is provided in said cap and is uncovered.

2. An electronic component according to claim 1, wherein an elastic material is injected through said at least one hole of said cap to cover a periphery of said piezoelectric resonator.

3. An electronic component according to claim 2, wherein said elastic material comprises rubber.

4. An electronic component according to claim 2, wherein the Young's modulus of said elastic material is less than or equal to about 12 kg/cm$^2$.

5. An electronic component according to claim 2, wherein said elastic material comprises a silicone resin.

6. An electronic component according to claim 1, wherein said piezoelectric resonator is constructed to vibrate in a longitudinal vibration mode.

7. An electronic component according to claim 1, wherein said piezoelectric resonator includes:
    a base member having a longitudinal direction, said base member comprising a plurality of laminated piezoelectric layers and a plurality of internal electrodes substantially perpendicular to the longitudinal direction of said base member and arranged along the longitudinal direction of said base member while being spaced apart from each other, said plurality of internal electrodes being provided on said piezoelectric layers substantially perpendicular to the longitudinal direction of said base member; and
    a pair of external electrodes provided on a surface of said base member and connected to said plurality of internal electrodes; wherein
    said plurality of piezoelectric layers are polarized along the longitudinal direction of said base member.

8. An electronic component according to claim 1, wherein a plurality of said piezoelectric resonators are connected on said substrate to define a ladder filter.

9. An electronic component according to claim 1, further comprising a plurality of holes each formed in said cap to extend from said space inside said cap to outside of said cap.

10. An electronic component according to claim 1, wherein a direction of polarization, a direction of application of electric field and a direction of vibration of the piezoelectric resonator are the same.

11. An electronic component comprising:
    a substrate;
    a pattern electrode disposed on said substrate;
    a piezoelectric resonator provided on said substrate and connected to said pattern electrode; and
    a cap provided on said substrate so as to cover said piezoelectric resonator and define a space inside said cap, the cap including a hole extending from said space inside said cap to outside of said cap is provided in said cap and is uncovered;
    wherein an elastic material is disposed in said space inside said cap to cover a periphery of said piezoelectric resonator.

12. An electronic component according to claim 11, wherein at least one hole extending from said space inside said cap to outside of said cap is provided in said cap.

13. An electronic component according to claim 11, wherein said elastic material comprises rubber.

14. An electronic component according to claim 11, wherein the Young's modulus of said elastic material is less than or equal to about 12 kg/cm$^2$.

15. An electronic component according to claim 11, wherein said elastic material comprises a silicone resin.

16. A communication apparatus comprising:

at least one band pass filter, the band pass filter comprising a piezoelectric component including:

a substrate;

a pattern electrode disposed on said substrate;

a plurality of piezoelectric resonators provided on said substrate and connected to said pattern electrode;

a cap provided on said substrate so as to cover said piezoelectric resonator and define a space inside said cap; and an elastic material disposed in said space inside of said cap to cover a periphery of said piezoelectric resonator;

wherein at least one hole extending from said space inside said cap to outside of said cap is provided in said cap and is uncovered.

17. A communication apparatus in accordance with claim 16, wherein the piezoelectric component is a first piezoelectric component, the communication apparatus further comprising a detector, wherein the detector comprises a second piezoelectric component including a substrate, a pattern electrode disposed on said substrate, a plurality of piezoelectric resonators provided on said substrate and connected to said pattern electrode, and a cap provided on said substrate so as to cover said piezoelectric resonators and define a space inside said cap, wherein at least one hole extending from said space inside said cap to outside of said cap is provided in said cap.

18. A communication apparatus in accordance with claim 16, wherein the band pass filter is a first band pass filter and the piezoelectric component is a first piezoelectric component, the communication apparatus further comprising a second band pass filter, wherein the second band pass filter comprises a second piezoelectric component including a substrate, a pattern electrode disposed on said substrate, a plurality of piezoelectric resonators provided on said substrate and connected to said pattern electrode, and a cap provided on said substrate so as to cover said piezoelectric resonators and define a space inside said cap, wherein at least one hole extending from said space inside said cap to outside of said cap is provided in said cap.

19. A communication apparatus in accordance with claim 16, wherein said communication apparatus comprises a double-super-heterodyne receiver.

20. A communication apparatus comprising:

at least one band pass filter, the band pass filter comprising a piezoelectric component including:

a substrate;

a pattern electrode disposed on said substrate;

a plurality of piezoelectric resonators provided on said substrate and connected to said pattern electrode; and a cap provided on said substrate so as to cover said piezoelectric resonator and define a space inside said cap, the cap including a hole extending from said space inside said cap to outside of said cap is provided in said cap and is uncovered;

wherein an elastic material is disposed in said space inside said cap to cover peripheries of said piezoelectric resonators.

21. A communication apparatus comprising:

at least one detector comprising a piezoelectric component including:

a substrate;

a pattern electrode disposed on said substrate;

a plurality of piezoelectric resonators provided on said substrate and connected to said pattern electrode; and a cap provided on said substrate so as to cover said piezoelectric resonator and define a space inside said cap; and an elastic material disposed in said space inside of said cap to cover a periphery of said piezoelectric resonator;

wherein at least one hole extending from said space inside said cap to outside of said cap is provided in said cap and is uncovered.

* * * * *